Sept. 13, 1960 W. K. HODDER 2,952,785

TRANSISTOR SWITCH

Filed June 9, 1959

INVENTOR.
WAYNE K. HODDER
BY
Christie, Parker & Hale
ATTORNEYS.

United States Patent Office 2,952,785

Patented Sept. 13, 1960

2,952,785

TRANSISTOR SWITCH

Wayne K. Hodder, Glendora, Calif., assignor, by mesne assignments, to Consolidated Electrodynamics Corporation, Pasadena, Calif., a corporation of California Filed June 9, 1959, Ser. No. 819,061

4 Claims. (Cl. 307—88.5)

This invention relates to transistor switches and, more particularly, is concerned with a transistor switching circuit for low level signals.

The use of transistors for switching low level signals has heretofore been proposed; for example, see the copending application Serial No. 454,060, filed September 3, 1954, by William Shockley, now Patent No. 2,891,171, issued June 16, 1959, and assigned to the same assignee as the present invention. In such circuits it is preferable to connect the emitter-collector current paths of two transistors in series between a signal source and a load, the two series transistors being controlled to provide either a high series impedance or a low series impedance between the source and the load. The direction of base current is controlled to render the series transistors either relatively conducting or relatively non-conducting to achieve a switching operation. The effect of the two transistors in series is to provide compensation for junction potentials which may be of the same order of magnitude as the signal being switched.

One difficulty encountered in using switches of the above type is that voltage spikes or transients are introduced across the load by the switch control voltage at the times of turning on and turning off the switch. The voltage spikes can be troublesome in certain low level switching applications.

The present invention provides a low level transistor switching circuit which substantially eliminates voltage transients across the output load during the switching on and switching off times of the transistor switch. This has been accomplished by providing means for balancing out current circulated through the load from the switch control circuit caused by stray capacitances in the switch control circuit.

For a complete understanding of the invention, reference should be made to the accompanying drawing, wherein.

Figure 1:
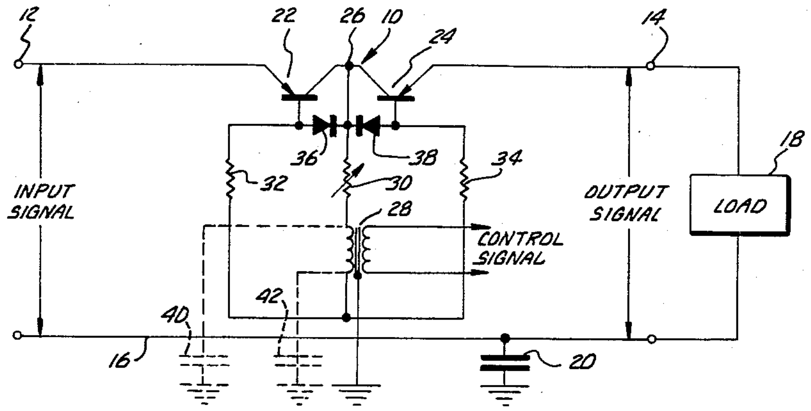
Fig. 1 is a schematic circuit diagram of the low level transistor switch.

Referring in detail to the circuit diagram of Fig. 1, the numeral 10 indicates generally a transistor switch for providing a variable impedance path between two terminals 12 and 14. For example, the switch 10 may be used for coupling an input signal applied between the terminal 12 and the common return 16 across a load 18 connected between the terminal 14 and the common return 16. The common return 16 may be ground, or may be coupled to ground through a capacitor 20. While the capacitor 20 is indicated as a lump capacitance, it may in practice exist in the form of stray capacitance between the common return conductor 16 and ground.

The transistor switch includes two transistors 22 and 24 which have their emitter-collector current paths connected in series between the terminals 12 and 14. The two transistors are preferably arranged with their collector electrodes connected to a common connection point 26. Control of current through the transistors between the terminals 12 and 14 is accomplished by voltages applied across the base-collector electrodes of the transistors. If a forward bias is applied across the base-collector terminals, the series resistance of the transistors is low, permitting a relatively high current to be passed between the terminals 12 and 14. On the other hand, if a reverse bias is applied between the base and collector electrodes, the current flow through the collector is cut off.

The transistors 22 and 24 are either forward biased or reverse biased in response to a switching control signal applied between the respective base and collector electrodes by means of a transformer 28, to which a switching control signal is applied. The secondary winding of the transformer 28 is connected at one end through a resistor 30 to the common connection point 26 between the respective collector electrodes of the two transistors, and is connected at the other end through the resistors 32 and 34 to the respective base electrodes of the transistors 22 and 24. In this manner, as the potential across the secondary of the transformer 28 reverses in polarity in response to a switching control voltage applied to the primary, the transistors 22 and 24 are either forward biased or reverse biased, thereby providing either a low impedance or a relatively high impedance in series between the terminals 12 and 14. The function of the resistors 32 and 34 is to limit the flow of base current of the associated transistors when they are forward biased. These resistors typically have a value of several thousand ohms each.

In addition, two diodes 36 and 38 are connected between the respective base electrodes and collector electrodes of the transistors 22 and 24. The diodes are connected so as to be forward biased by the control signal at the time the transistors 22 and 24 are reverse biased. Thus the diodes 36 and 38 have the effect of limiting the base-to-collector potential of the transistors when they are reverse biased.

One of the causes of transient voltage spikes across the load 18 to which the present invention is directed, is the distributed capacity to ground of the secondary winding of the transformer 28. This distributed capacity is represented in the drawing by the dash lines indicating lumped capacitors 40 and 42 connecting the ends of the transformer secondary to ground. It will be readily apparent that charging or discharging currents for the capacitors 40 and 42 divide between two possible current conductive paths including respectively the source impedance and the load impedance. The current through the source impedance is of no consequence. However, the charging and discharging currents through the load 18 produce transient voltage effects which may be undesirable, particularly if the load is a fast-response measuring device for measuring the magnitude of the input signal.

Figure 2:
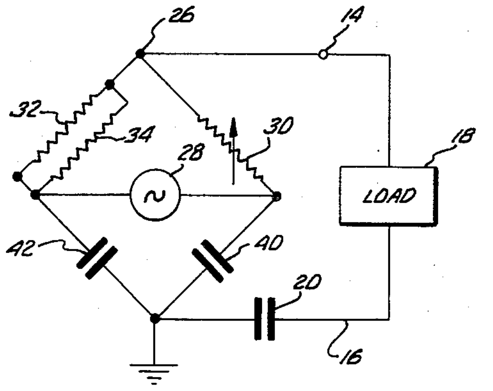
Fig. 2 is a simplified equivalent circuit illustrating the manner in which the circuit functions.

The manner in which the circuit of Fig. 1 eliminates the effect of these voltage spikes can best be appreciated by the equivalent circuit shown in Fig. 2. In this circuit, the transformer 28 is indicated as an alternating current source which is connected across one diagonal of a bridge circuit, two legs of which comprise the stray capacitance, represented by the capacitors 40 and 42, of the transformer secondary to ground, and the other two legs of which comprise respectively the resistor 30 and the resistors 32 and 34 in parallel. The load 18 is connected across the other diagonal of the bridge through the capacitor 20, if the common return 16 is not in fact grounded.

While it will be appreciated from examination of the actual circuit of Fig. 1 that the resistors 32 and 34 and 30 are not directly connected to the common point 26 as indicated in the equivalent circuit of Fig. 2, the base-to-collector impedance of the transistors when forward biased, and the impedance of the diodes 36 and 38 when the transistors are reverse biased, are so low compared to the value of the resistors, that for all practical purposes they can be neglected.

It will be readily apparent from the circuit of Fig. 2 that only by the addition of the resistor 30 can the equivalent bridge circuit be made to balance. In the absence of the resistor 30 during the charging and discharging of the capacitors 40 and 42, a potential is produced across the diagonal of the bridge to which the load 18 is connected. Assuming that the capacitors 40 and 42 are substantially equal as would be true for a balance at the secondary winding, and assuming that the resistors 32 and 34 are equal, the bridge will be balanced by making the resistor 30 half the value of the resistors 32 and 34. The resistor 30, however, may be adjusted from this nominal value in practice to achieve maximum compensation by balance of the bridge circuit empirically.

From the above description it will be recognized that by the addition of the resistor 30 and the diodes 36 and 38 in the circuit of Fig. 1, compensation for the transient effect of the stray capacitance in the secondary of the transformer 28 is achieved.

What is claimed is:

1. A two-terminal transistor switching circuit comprising a pair of transistors having emitter and collector elements providing a controlled load current conductive path through each transistor, the transistors having a common connection between one of said elements of each transistor and having the other of said elements respectively connected to the two terminals forming the two-terminal circuit, whereby said current conductive paths are in series between the two terminals of the switching circuit, the transistors further having base elements forming respective control current paths with the other elements of the transistors joined in said common connection, and a control voltage source for varying the direction of current flowing through the respective control current paths including a transformer having a secondary winding, resistors of equal value respectively connecting one end of the secondary winding to the base elements of the two transistors, a resistor of the order of half the value of said equal value resistors connecting the other end of the secondary winding to said common connection between the transistors, and a pair of diodes connected respectively between the base elements of the transistors and said common connection between the transistors, both the diodes being connected to provide a low impedance path in the same direction relative to the common connection.

2. A two-terminal transistor switching circuit comprising a pair of transistors having emitter and collector elements providing a controlled load current conductive path through each transistor, the transistors having a common connection between one of said elements of each transistor and having the other of said elements respectively connected to the two terminals forming the two-terminal circuit, whereby said current conductive paths are in series between the two terminals of the switching circuit, the transistors further having base elements forming respective control current paths with the other elements of the transistors joined in said common connection, and a control voltage source for varying the direction of current flowing through the respective control current paths including a transformer having a secondary winding, resistors respectively connecting one end of the secondary winding to the base elements of the two transistors, a resistor connecting the other end of the secondary winding to said common connection between the transistors, and a pair of diodes connected respectively between the base elements of the transistors and said common connection between the transistors, both the diodes being connected to provide a low impedance path in the same direction relative to the common connection.

3. A two-terminal transistor switching circuit comprising a pair of transistors having emitter and collector elements providing a controlled load current conductive path through each transistor, the transistors having a common connection between one of said elements of each transistor and having the other of said elements respectively connected to the two terminals forming the two-terminal circuit, whereby said current conductive paths are in series between the two terminals of the switching circuit, the transistors further having base elements forming respective control current paths with the other elements of the transistors joined in said common connection, and a control voltage source for varying the direction of current flowing through the respective control current paths including a transformer having a secondary winding, resistors of equal value respectively connecting one end of the secondary winding to the base elements of the two transistors, and a resistor of the order of half the value of said equal value resistors connecting the other end of the secondary winding to said common connection between the transistors.

4. A two-terminal transistor switching circuit comprising a pair of transistors having emitter and collector elements providing a controlled load current conductive path through each transistor, means for electrically connecting one of said elements of each transistor to a common connection point, means for connecting the other of said elements respectively to the two terminals forming the two-terminal circuit, whereby said current conductive paths are in series between the two terminals of the switching circuit, the transistors further having base elements forming respective control current paths with the other elements of the transistors joined in said common connection, and a control voltage source for varying the direction of current flowing through the respective control current paths including a transformer having a secondary winding, resistors respectively connecting one end of the secondary winding to the base elements of the two transistors, and a resistor connecting the other end of the secondary winding to said common connection point.

No references cited.